United States Patent [19]
Wolf et al.

[11] Patent Number: 5,016,257
[45] Date of Patent: May 14, 1991

[54] RECEIVER FOR BANDSPREAD SIGNALS, PARTICULARLY GPS RECEIVER

[75] Inventors: Michael Wolf, Schwäbisch Gmünd; Wolfgang Beier, Weil der Stadt, both of Fed. Rep. of Germany

[73] Assignee: Standard Elektrik Lorenz AG, Stuttgart, Fed. Rep. of Germany

[21] Appl. No.: 323,570

[22] Filed: Mar. 13, 1989

[30] Foreign Application Priority Data

Mar. 12, 1988 [DE] Fed. Rep. of Germany ....... 3808328

[51] Int. Cl.$^5$ ............................................. H04K 1/00
[52] U.S. Cl. .......................................... 375/1; 380/34
[58] Field of Search ............................... 375/1; 380/34

[56] References Cited

U.S. PATENT DOCUMENTS

| | | | |
|---|---|---|---|
| 4,317,204 | 2/1982 | Gordy et al. | 375/1 |
| 4,494,238 | 1/1985 | Groth, Jr. | 375/1 |
| 4,554,668 | 11/1985 | Deman et al. | 375/1 |
| 4,639,932 | 1/1987 | Schiff | 375/1 |
| 4,672,629 | 6/1987 | Beier | 375/1 |
| 4,701,934 | 10/1987 | Jasper | 375/1 |
| 4,761,795 | 8/1988 | Beier | 375/1 |
| 4,841,544 | 6/1989 | Nuytkens | 375/1 |

FOREIGN PATENT DOCUMENTS 2048056 10/1978 Fed. Rep. of Germany .
3427058 7/1984 Fed. Rep. of Germany .
3601576 1/1986 Fed. Rep. of Germany .

OTHER PUBLICATIONS

Navigation: The Journal of Navigation, "GPS Signal Structure and Performance Characteristics", J. J. Spilker, Jr., pp. 121–146.

Primary Examiner—Salvatore Cangialosi
Attorney, Agent, or Firm—Christie, Parker & Hale

[57] ABSTRACT

Receivers for bandspread signals have a carrier PLL (20) for the carrier frequency and phase and a code PLL (20, 30 . . . 34) for the code frequency and phase. To be able to receive even very noisy signals, the carrier PLL, in particular, must have a very narrow bandwidth. This results in a very narrow capture range.

According to the invention, instead of employing a complicated search strategy, advantage is taken of the fact that the code PLL locks in more easily. A signal is taken from the code PLL which indicates the difference between the desired value and the actual value of the code frequency. This signal is fed as an additional control signal to the carrier PLL.

7 Claims, 1 Drawing Sheet

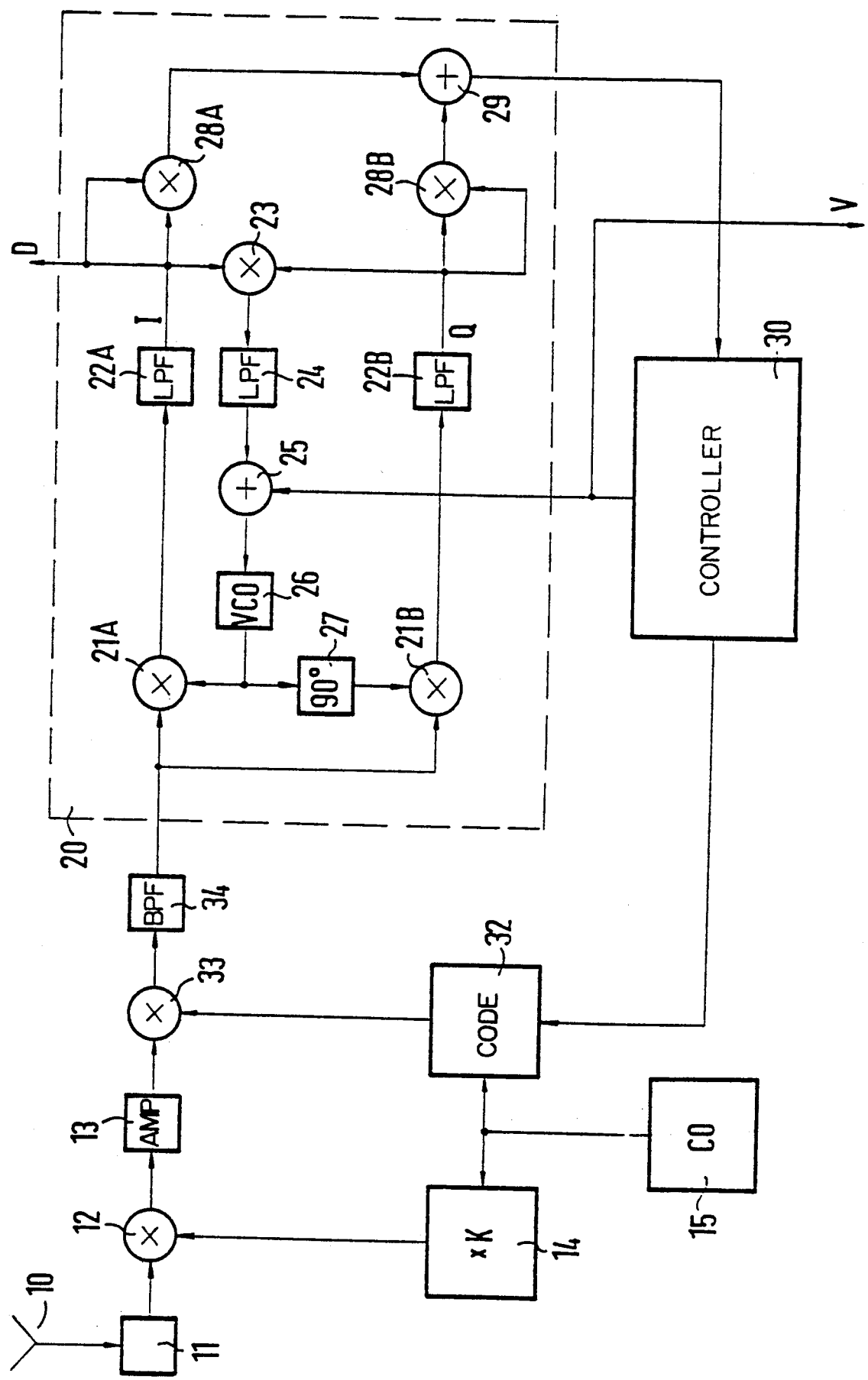

RECEIVER FOR BANDSPREAD SIGNALS, PARTICULARLY GPS RECEIVER

TECHNICAL FIELD

The present invention relates to a receiver for bandspread signals.

CLAIM FOR PRIORITY

This application is based on and claims priority from an application first filed in Fed. Rep. Germany on Mar. 12, 1988 under serial number P38 08 328.0. To the extent such prior application may contain any additional information that might be of any assistance in the use and understanding of the invention claimed herein, it is hereby incorporated by reference.

BACKGROUND ART

A receiver for ASK or PSK bandspread signals having a code phase-locked loop for recovering the frequency and phase of the predetermined bandspreading code and a carrier phase-locked loop for recovering the frequency and phase of the carrier, though not designed for the Global Positioning System (GPS), is disclosed in published German Patent DE-C1 20 48 056.

Receivers for bandspread signals must be designed to be capable of receiving signals even if the latter are extremely noisy or lost in noise. Where the signal is evaluated, i.e., after demodulation with the aid of the code used for bandspreading, the signal should therefore be as narrow-band as possible, in order to contain as little noise as possible. The narrower the bandwidth of a receiver, however, the more difficult it will be to find the desired signal in case of frequency deviations. The capture range of a phase-locked loop, for example, is directly proportional to its bandwidth.

Bandspread signals are frequently employed in military equipment or in satellite communication, where greater relative speeds of transmitter and receiver result in a Doppler shift which is clearly greater than the desired receiver bandwidth. Therefore, the receiver must first be tuned to the current frequency, preferably using an automatic search strategy. Because of the narrow bandwidth required (order of 1 Hz), however, this tuning must not be very fast and may even lag behind the change in frequency due to the Doppler effect.

In the GPS, a total of 18 satellites are to form a uniform network around the earth and transmit navigation signals at a common frequency, but with different codes. From the signals received from four of these satellites at a time, whose directions should be as different as possible, one can determine the common system time and the receiver position in three coordinates. The GPS is described in greater detail in an article by J. J. Spilker, jr., "GPS Signal Structure and Performance Characteristics", Navigation: Journal of the Institute of Navigation, Vol. 25, No. 2, Summer 1978, pages 121 to 146.

To receive four satellites, use can be made of four separate receivers, but it is also possible to use a single receiver which receives the four satellites in succession. In this case, however, the problem of the tuning time becomes even more critical. It can be slightly alleviated by using the respective last determined values or value extrapolated therefrom as preset values. When the receiver is turned on or leaves a dead spot, however, the problem arises again with full severity.

DISCLOSURE OF INVENTION

It is the object of the present invention to provide a receiver which is quickly tuned to the current frequency.

A bandspread receiver constructed in accordance with the present invention utilizes the fact that the frequency and phase of the code can be found more quickly than the frequency and phase of the carrier—this is also mentioned in the above referred to German Patent 20 48 056—, and the fact that changes in frequency, particularly changes due to the Doppler effect, have the same effect on the carrier and the code.

In the GPS, the two frequencies are derived in the transmitters from a common frequency standard. If the two frequencies are compared in the receiver with a frequency generated by the same reference oscillator, a very good transient response will be obtained. It is thus possible to achieve a satisfactory result even with a reference oscillator of lower Q.

If the frequency and phase of the carrier are recovered in a very low IF range (zero IF), a large part of the signal processing can be performed by a program-controlled digital signal-processing circuit. In this manner, a very high-quality receiver can be implemented at relatively low cost.

BRIEF DESCRIPTION OF DRAWINGS

An embodiment of the invention will now be explained in greater detail with reference to the accompanying drawing, which is a block diagram of a GPS receiver constructed in accordance with the invention.

BEST MODE FOR CARRYING OUT THE INVENTION

The drawing is a block diagram of a receiver according to the invention. It is readily possible, e.g., with the aid of the inventive concepts disclosed in commonly assigned published German patent applications DE-OS 34 27 058 (corresponding to U.S. Pat. No. 4,672,629 entitled "Receiver for Bandspread Signals") or similarly titled DE-OS 36 01 576 (corresponding to U.S. Pat. No. 4,761,795), to implement part of the circuit of this block diagram with a program-controlled digital signal-processing circuit.

The signal coming from an antenna 10 passes through a selective preamplifier 11, a mixer 12, a selective amplifier 13, a synchronous demodulator 33, and a band-pass filter 34 and is applied to a carrier phase-locked loop 20.

The carrier phase-locked loop 20 delivers, on the one hand, the data D, modulated onto the signal by phase-shift keying by 180 degrees (equivalent to amplitude-shift keying), and, on the other hand, a quantity which is proportional to the square of the absolute value of the signal amplitude and is to be made a maximum with the aid of a code phase-locked loop. The code phase-locked loop contains, on the one hand, the carrier phase-locked loop 20 and, on the other hand, a controller 30, a code generator 32, and the above-mentioned synchronous demodulator 33, which is followed by the band-pass filter 34.

The code generator 32 is clocked by a crystal-controlled reference oscillator 15 and delivers a code signal corresponding to the code by which the signal to be received is modulated for transmitter identification and bandspreading purposes. The GPS uses two codes per transmitter by which the phase of the carrier of the transmitter is keyed by 180 degrees. Further phase shifts of the carrier by 90° result from the fact that the two codes are shifted with respect to each other in such a way that a four-phase PSK signal is obtained. The code evaluated here, which is in phase with the carrier, has a length of 1023 bits and a frequency of 1.023 MHz and, thus, a repetition frequency of 1 kHz. If at the synchronous demodulator the frequency, phase, and bit sequence of the received code agree with the frequency, phase, and bit sequence of the code generated in the code generator 32, this neutralizes the modulation. The bandspread signal becomes narrow-band again and can pass through the band-pass filter 34, whereas the undemodulated signals from transmitters received on the same frequency cannot pass through the band-pass filter 34 because of the bandspreading. In addition, because of the absence of demodulation, their time-average amplitude is zero.

Since the code generator 32 is clocked by a crystal-controlled oscillator, its frequency as such cannot be influenced. The phase, however, can be influenced by the controller 30 adding or suppressing individual clock pulses. A continuous rather than single phase change, however, is equivalent to a frequency change. This frequency change, which, to a first degree of approximation (i.e., if the frequency of the reference oscillator and the transmitted frequency are free of errors), is proportional to the Doppler shift and, hence, to the relative velocity of transmitter and receiver, is determined in the controller 30 and delivered as a signal V for evaluation. This signal V is also fed as the additional control quantity according to the invention to the carrier phase-locked loop 20.

The controller 30 is so designed that the entire code phase-locked loop has the characteristic of a control loop known as "delta loop" or "tau dither loop". Such control loops are used if two codes which are identical but can be shifted in phase with respect to each other are to be synchronized in phase. If the codes are random or pseudorandom sequences (PRN=pseudorandom noise) or even Barker codes, a signal suitable for control purposes will be obtained only if the deviation is not more than one bit. In addition, the direction of a deviation is not directly recognizable. Examples of the implementation of such control circuits are contained in the above-mentioned article by J. J. Spilker, jr.

During frequency conversion by mixing, the phase-shift keying (like any modulation) is preserved. Evaluation can therefore take place in any frequency range. In the embodiment being described, a very low IF range was chosen. This makes it possible to use program-controlled digital signal-processing circuits. In the PSK system, however, the intermediate frequency 0 Hz must not be reached, since any oscillation about this zero line would cause additional phase jumps. The intermediate frequency was chosen to be 10 kHz, so that the signal, including the modulation, will not reach the zero line even at the maximum Doppler shift (about 5 kHz) and in case of deviations of the reference oscillator from the desired value.

The intermediate frequency is achieved in the mixer 12 in one step and filtered out in the selective amplifier 13. The mixing frequency for the mixer 12 is derived in a frequency multiplier 14 by multiplying the frequency of the crystal-controlled reference oscillator 15 by a factor of K.

The carrier phase-locked loop 20 is implemented as a conventional Costas loop. It has two branches A and B for the in-phase signal I and the quadrature signal Q, respectively. In a voltage-controlled oscillator 26, the carrier is simulated (in the IF range) in frequency and phase. This signal is mixed with the output from the band-pass filter 34 directly (in branch A) and after passing through a 90-degree phase shifter 27 (in branch B), the mixing taking place in synchronous demodulators 21A and 21B, respectively. Low-pass filters 22A and 22B then form the in-phase signal I and the quadrature signal Q, respectively. The in-phase signal I contains the data D in the sign. The sign of the quadrature signal Q, too, changes with the data D. Multiplication of the in-phase signal I by the quadrature signal Q in a multiplier 23 yields a signal which is independent of the data D. This signal is filtered in a low-pass filter 24 and fed as a control quantity to the oscillator 26. The in-phase signal I is thus maintained at its maximum amplitude.

In a summer 25, the signal V from the controller 30 is added to this control quantity. In this manner, a preset condition is established which allows for the Doppler shift.

The in-phase signal I and the quadrature signal Q are squared by two squarers 28A and 28B, respectively, and a subsequent summer 29 forms the sum of these two squares. The result is the quantity proportional to the square of the absolute value of the signal amplitude. This quantity is fed as a control quantity to the controller 30.

Reference Characters

| A, B | Branches |
|---|---|
| D | Data |
| I | In-phase signal |
| K | Factor |
| Q | Quadrature signal |
| V | Signal |
| 10 | Antenna |
| 11 | Preamplifier, selective |
| 12 | Mixer |
| 13 | Preamplifier, selective |
| 14 | Frequency multiplier |
| 15 | Reference oscillator, crystal-controlled |
| 20 | Carrier phase-locked loop |
| 21A, B | Synchronous demodulator |
| 22A, B | Low-pass filter |
| 23 | Multiplier |
| 24 | Low-pass filter |
| 25 | Summer |
| 26 | Voltage-controlled oscillator |
| 27 | Phase shifter |
| 28A, B | Squarer |
| 29 | Summer |
| 30 | Controller |
| 32 | Code generator |
| 33 | Synchronous demodulator |
| 34 | Band-pass filter |

We claim:
1. A receiver for a spread spectrum signal generated using a predetermined code at a remote transmitter, said receiver comprising:
   reference means for generating a receiver reference frequency independent of a transmitter reference frequency used by the remote transmitter,
   a first phase-locked loop wherein said predetermined code and said receiver reference frequency are used to recover a code frequency and a code phase with which the received spread spectrum signal is converted into a narrowband signal having a narrower bandwidth than the received spread spectrum signal and comprising a carrier signal modu- lated with a data signal, said first phase-locked loop further comprising:

frequency correction means responsive to the recovered code frequency for generating a frequency correction signal representative of deviations in the recovered code frequency relative to the receiver reference frequency; and a second phase-locked loop wherein the carrier signal is simulated in frequency and phase in response to a control signal, said second phase-locked loop further comprising:

phase correction means for generating a phase correction signal representative of deviations in the phase of the simulated carrier signal, and summer means for combining said frequency correction signal with said phase correction signal to thereby form said control signal.

2. A receiver as claimed in claim 1, wherein the recovery of the carrier frequency and of the carrier phase takes place in the intermediate-frequency range of the carrier.

3. A receiver as claimed in claim 2, wherein the intermediate frequency is chosen to be just nonzero at the maximum permissible deviation from its desired value.

4. A receiver as claimed in claim 1, wherein
said means for generating a reference frequency further comprises a reference oscillator,
said first phase-locked loop further comprises
a code generator clocked by the reference oscillator, and
a synchronous demodulator responsive to an output of the code generator,
the phase and the effective frequency of the output of the code generator are changed in response to phase shift signals, and
said frequency correction signal corresponds to said phase shift signals.

5. A receiver as claimed in claim 4, wherein said frequency correction signal is proportional to the speed at which said phase shift signals cause the phase of said reference oscillator to be changed.

6. A receiver as claimed in claim 1, further comprising a mixer in which received signals are mixed with a signal derived in a frequency multiplier from the reference frequency.

7. A receiver as claimed in claim 1, wherein at least a portion of one of the phase-locked loops comprises a digital signal-processing circuit.

* * * * *